(12) United States Patent
Ji et al.

(10) Patent No.: US 8,653,611 B2
(45) Date of Patent: Feb. 18, 2014

(54) SEMICONDUCTOR DEVICE WITH METAL GATES AND METHOD FOR FABRICATING THE SAME

(75) Inventors: Yun-Hyuck Ji, Gyeonggi-do (KR); Tae-Yoon Kim, Gyeonggi-do (KR); Seung-Mi Lee, Gyeonggi-do (KR); Woo-Young Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 282 days.

(21) Appl. No.: 13/027,379

(22) Filed: Feb. 15, 2011

(65) Prior Publication Data
US 2012/0025327 A1    Feb. 2, 2012

(30) Foreign Application Priority Data
Jul. 30, 2010    (KR) .................. 10-2010-0074356

(51) Int. Cl.
*H01L 29/51*    (2006.01)
(52) U.S. Cl.
USPC .................................. 257/411; 257/E29.255
(58) Field of Classification Search
None
See application file for complete search history.

(56) References Cited

U.S. PATENT DOCUMENTS

| 6,506,647 B2* | 1/2003 | Kuroda et al. | 438/275 |
| 2006/0030097 A1* | 2/2006 | Jeon et al. | 438/199 |
| 2010/0187612 A1* | 7/2010 | Ikeno et al. | 257/369 |

FOREIGN PATENT DOCUMENTS

| JP | 2010-073865 | 4/2010 |
| JP | 2010-135427 | 6/2010 |
| KR | 100644114 | 11/2006 |

OTHER PUBLICATIONS

Office Action issued by the Korean Intellectual Property Office on Mar. 26, 2012.
Notice of Allowance issued by the Korean Intellectual Property Office on Apr. 25, 2013.

* cited by examiner

*Primary Examiner* — Wensing Kuo
(74) *Attorney, Agent, or Firm* — IP & T Group LLP

(57) ABSTRACT

A semiconductor device includes a gate insulation layer formed over a substrate and having a high dielectric constant, a gate electrode formed over the gate insulation layer and a work function control layer formed between the substrate and the gate insulation layer and inducing a work function shift of the gate electrode.

19 Claims, 6 Drawing Sheets

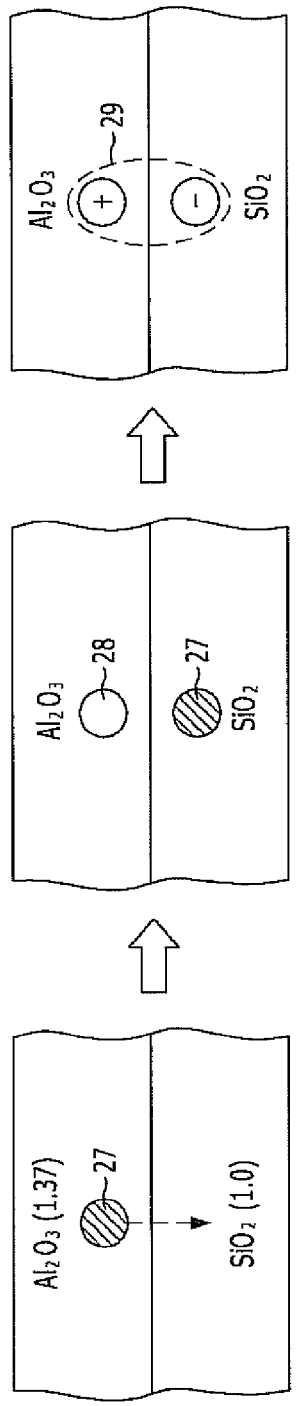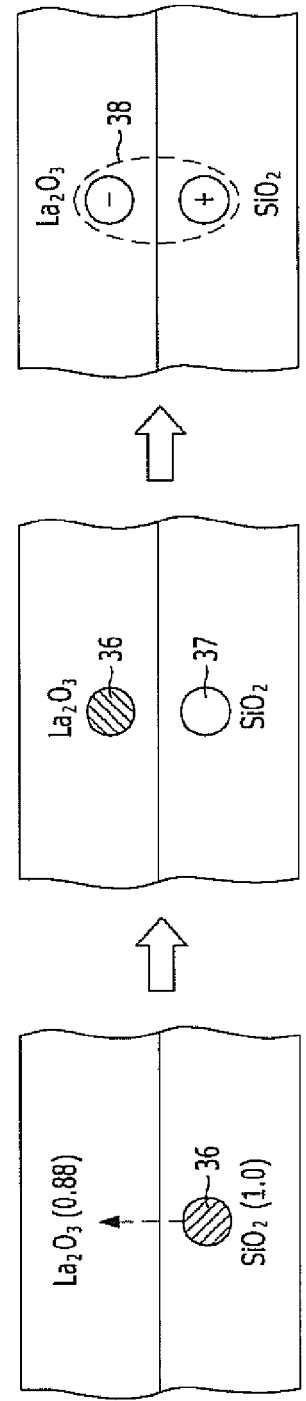

SEMICONDUCTOR DEVICE WITH METAL GATES AND METHOD FOR FABRICATING THE SAME

CROSS-REFERENCE TO RELATED APPLICATIONS

The present application claims priority of Korean Patent Application No. 10-2010-0074356, filed on Jul. 30, 2010, which is incorporated herein by reference in its entirety.

BACKGROUND OF THE INVENTION

Exemplary embodiments of the present invention relate to a semiconductor device fabrication method, and more particularly, to a semiconductor device having metal gates and a method for fabricating the semiconductor device.

Semiconductor devices, operating at a high data rate, include both NMOSFETs and PMOSTFETs. Since the NMOSFET and the PMOSTFET both operate at a high speed, it is desired that a gate electrode of the NMOSFETs and a gate electrode of the PMOSFETs have a proper work function individually to have optimal characteristics. In other words, the work function of the gate electrode of the NMOSTFETs may approach the energy level of the edges of silicon conduction band, and the work function of the gate electrode of the PMOSTFETs may approach the energy level of the edges of silicon valence band. In this case, the channels of the NMOSFETs and the PMOSFETs may be formed as surface channels. Therefore, the NMOSFETs and the PMOSFETs may all operate at a high speed.

FIG. 1 illustrates a structure of a conventional semiconductor device.

Referring to FIG. 1, an isolation layer 12 is formed over a semiconductor substrate 11. The isolation layer 12 defines a first region 101 where an NMOSFET is formed and a second region 102 where a PMOSFET is formed in the semiconductor substrate 11. Over the first region 101, a first gate 103 is formed, and a second gate 104 is formed over the second region 102. The first gate 103 is formed by stacking a silicon oxide ($SiO_2$) layer 13A, an $N^+$-doped polysilicon layer 14A, and a tungsten (W) layer 15A. The second gate 104 is formed by stacking a silicon ($SiO_2$) oxide layer 13B, a $P^+$-doped polysilicon layer 14B, and a tungsten (W) layer 15B.

In accordance with the conventional semiconductor device, which is described above, the silicon oxide ($SiO_2$) layers 13A and 13B are grown to have a thickness less than 30 Å for the purpose of increasing a drive current. However, a leakage current value may increase due to a direct tunneling effect. Accordingly, off-state characteristics may be deteriorated and thus there are limitations in applying the technology to low-power mobile products.

Moreover, the conventional technology may require complicated fabrication processes, such as a process of performing a polysilicon deposition, a lithography process, and an ion implantation process to be performed in order to form the $N^+$-doped polysilicon layer 14A and the $P^+$-doped polysilicon layer 14B, which are used as gate electrodes.

Also, a dopant of the $P^+$-doped polysilicon layer 14B, such as boron, may penetrate into a gate insulation layer under the $P^+$-doped polysilicon layer 14B, which is the silicon oxide ($SiO_2$) layer 13B, and increase leakage current.

Furthermore, according to the conventional technology, since the gate electrodes are formed of the polysilicon layers doped with N-type and P-type impurities, their resistivity is high, and the operation speed of an NMOSFET and a PMOSFET may be lowered due to a depletion region formed in such gate electrodes.

SUMMARY OF THE INVENTION

Exemplary embodiments of the present invention are directed to a semiconductor device, which may decrease leakage current of a gate insulation layer and increase operation current, and a fabrication method thereof.

In accordance with an exemplary embodiment of the present invention, a semiconductor device includes: a gate insulation layer formed over a substrate and having a high dielectric constant; a gate electrode formed over the gate insulation layer; and a work function control layer formed between the substrate and the gate insulation layer and inducing a work function shift of the gate electrode.

The work function control layer may include a first layer and a second layer having a higher oxygen concentration per unit area than the first layer. The first layer may include a silicon oxide layer, and the second layer may include an aluminum oxide layer. The work function control layer may include a first layer and a second layer having a lower oxygen concentration per unit area than the first layer. The first layer may include a silicon oxide layer, and the second layer may include a lanthanum oxide layer.

In accordance with another exemplary embodiment of the present invention, a semiconductor device includes: a gate insulation layer formed over first and second regions of a substrate and having a high dielectric constant; a gate electrode formed over the gate insulation layer; and a work function control layer formed between the substrate and the gate insulation layer and configured to increase a work function of the gate electrode in the first region of the substrate and decrease a work function of the gate electrode in the second region of the substrate.

In accordance with still another exemplary embodiment of the present invention, a method for fabricating a semiconductor device includes: forming a first work function control layer over a first region of a substrate; forming a second work function control layer over a second region of the substrate; forming a gate insulation layer having a high dielectric constant over the substrate, after forming the first and second work function control layers; forming a gate conductive layer over the gate insulation layer; and forming a first gate and a second gate having different work functions in the first region and the second region, respectively, by etching the gate conductive layer, the gate insulation layer, the first work function control layer, and the second work function control layer.

The first region may be a region for forming a PMOSFET, and the first gate may be a gate of the PMOSFET. The second region may be a region for forming an NMOSFET, and the second gate may be a gate of the NMOSFET.

BRIEF DESCRIPTION OF THE DRAWINGS

FIGS. 3 and 4 describe a dipole formation principle of a work function control layer in accordance with the exemplary embodiments of the present invention.

DESCRIPTION OF SPECIFIC EMBODIMENTS

Figure 1:
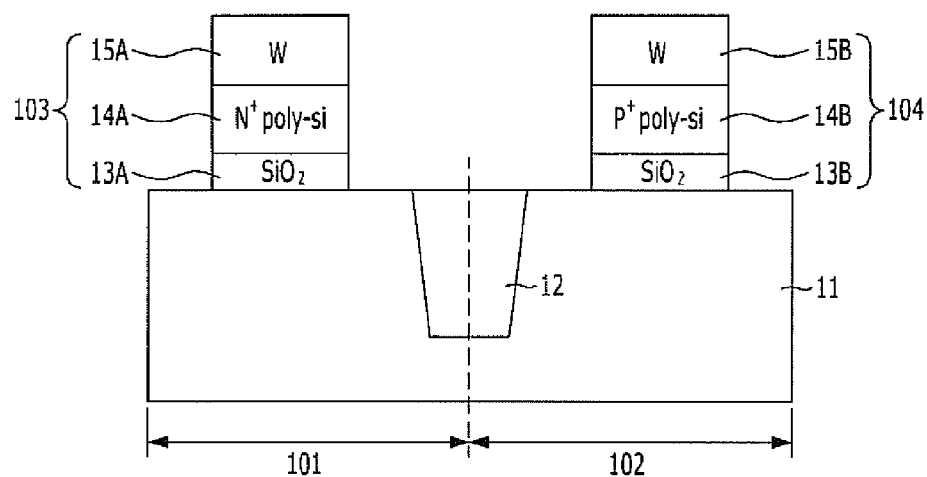
FIG. 1 illustrates a structure of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The technology of the present invention uses a metal silicate having a high dielectric constant as a gate insulation layer to improve off-state characteristics by decreasing leakage current. The metal silicate may include hafnium silicate (HfSiO).

Also, a metal nitride is formed as a gate electrode to increase drive current. The metal nitride layer may include a titanium nitride (TiN) layer. Also, a work function control layer is formed to induce a work function shift of the gate electrode so that the drive current is increased. The work function control layer increases or decreases the work function of the gate electrode. In an NMOSFET, the work function control layer may be formed to decrease the work function of the gate electrode. In a PMOSFET, the work function control layer may be formed to increase the work function of the gate electrode.

Figure 2A:
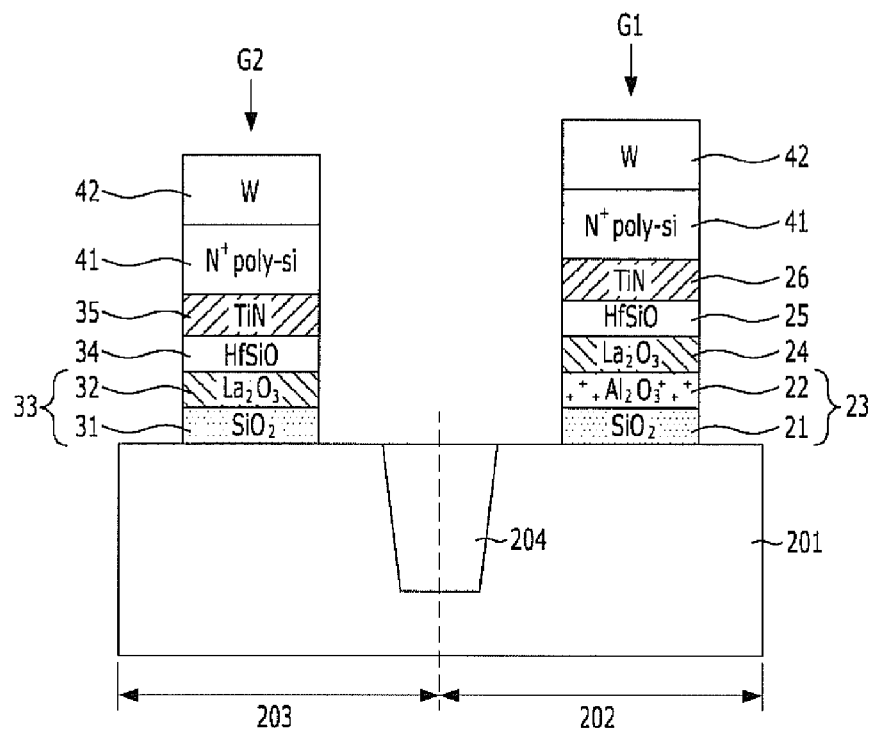
FIG. 2A illustrates a semiconductor device in accordance with a first exemplary embodiment of the present invention.

FIG. 2A illustrates a semiconductor device in accordance with a first exemplary embodiment of the present invention.

Referring to FIG. 2A, an isolation layer 204 which electrically separates a first region 202 and a second region 203 from each other is formed over a substrate 201. The first region 202 is a region for a PMOSFET, and the second region 203 is a region for an NMOSFET. The substrate 201 may be a silicon substrate.

A first gate G1 and a second gate G2 are formed over the substrate 201. The first gate G1 is formed over the first region 202 and becomes a gate of the PMOSFET. The second gate G2 is formed over the second region 203 and becomes a gate of the NMOSFET.

The first gate G1 is formed by first stacking a first work function control layer 23, a first gate insulation layer 25, and a first gate electrode 26. The first gate insulation layer 25 includes a high dielectric layer having a high dielectric constant (i.e., high-k). The first gate insulation layer 25 is formed of a metal silicate. According to an exemplary embodiment of the present invention, the metal silicate may include hafnium silicate (HfSiO). The first gate electrode 26 includes a metal nitride layer. According to an exemplary embodiment of the present invention, the first gate electrode 26 may include a titanium nitride (TiN) layer.

The first work function control layer 23 is formed between the substrate 201 and the first gate insulation layer 25 and induces a work function shift of the first gate electrode 26. In particular, the first work function control layer 23 increases the work function of the first gate electrode 26. The first work function control layer 23 includes a first interface layer 21 and a first capping layer 22 which has a higher oxygen concentration per unit area than the first interface layer 21. The first interface layer 21 may include a silicon oxide ($SiO_2$) layer, and the first capping layer 22 may include an aluminum oxide ($Al_2O_3$) layer. The silicon oxide ($SiO_2$) layer has an oxygen concentration of approximately 1 mol/volume, while the aluminum oxide layer has an oxygen concentration of approximately 1.37 mol/volume. Accordingly, a dipole is formed between the silicon oxide ($SiO_2$) layer and the aluminum oxide layer. For example, when the silicon oxide ($SiO_2$) layer and the aluminum oxide layer come into contact with each other, the oxygen of the aluminum oxide layer diffuses into the silicon oxide ($SiO_2$) layer. Accordingly, oxygen vacancies are formed in the aluminum oxide layer and the aluminum oxide layer with the oxygen vacancies becomes electrically positive, and the silicon oxide ($SiO_2$) layer into which the oxygen diffuses becomes electrically negative. As a result, a dipole is formed between the two materials which are electrically positive and negative respectively. According to an exemplary embodiment of the present invention, when the aluminum oxide layer is formed over the silicon oxide ($SiO_2$) layer, the aluminum oxide layer becomes electrically positive and the silicon oxide ($SiO_2$) layer becomes electrically negative. Therefore, the work function of the first gate electrode 26 is increased.

Meanwhile, the second gate G2 is formed by stacking a second work function control layer 33, a second gate insulation layer 34, and a second gate electrode 35. The second gate insulation layer 34 includes a high dielectric layer having a high dielectric constant (i.e., high-k). The second gate insulation layer 34 may be formed of hafnium silicate (HfSiO). The second gate electrode 35 includes a metal nitride layer. According to an exemplary embodiment of the present invention, the second gate electrode 35 may include a titanium nitride (TiN) layer.

The second work function control layer 33 is formed between the substrate 201 and the second gate insulation layer 34 and induces a work function shift of the second gate electrode 35. In particular, the second work function control layer 33 decreases the work function of the second gate electrode 35. The second work function control layer 33 includes a second interface layer 31 and a second capping layer 32 which has a lower oxygen concentration per unit area than the second interface layer 31. The second interface layer 31 may include a silicon oxide ($SiO_2$) layer, and the second capping layer 32 may include a lanthanum oxide ($La_2O_3$) layer. The silicon oxide ($SiO_2$) layer has an oxygen concentration of approximately 1 mol/volume, while the lanthanum oxide ($La_2O_3$) layer has an oxygen concentration of approximately 0.88 mol/volume. Accordingly, a dipole is formed between the silicon oxide ($SiO_2$) layer and the lanthanum oxide ($La_2O_3$) layer. For example, when the silicon oxide ($SiO_2$) layer and the lanthanum oxide ($La_2O_3$) layer come into contact with each other, the oxygen of the silicon oxide ($SiO_2$) layer diffuses into the lanthanum oxide ($La_2O_3$) layer. Accordingly, oxygen vacancies are formed in the silicon oxide ($SiO_2$) layer. Thus, the silicon oxide ($SiO_2$) layer with the oxygen vacancies becomes electrically positive, and the lanthanum oxide ($La_2O_3$) layer into which the oxygen diffuses becomes electrically negative. As a result, a dipole is formed between the electrically positive material and the electrically negative material. According to an exemplary embodiment of the present invention, when the lanthanum oxide ($La_2O_3$) layer is formed over the silicon oxide ($SiO_2$) layer, the silicon oxide ($SiO_2$) layer becomes electrically positive and the lanthanum oxide ($La_2O_3$) layer becomes electrically negative. Therefore, the work function of the second gate electrode 35 is decreased.

The first gate G1 and the second gate G2 individually include an anti-reaction layer 41 and a low-resistance metallic layer 42 which are stacked over the first gate electrode 26 and the second gate electrode 35. The anti-reaction layer 41 includes a polysilicon layer. The polysilicon layer is doped with an N-type impurity of high concentration. The low-resistance metallic layer 42 is formed of a material for decreasing the resistance of each gate. For example, the low-resistance metallic layer 42 may include a tungsten (W) layer.

A lanthanum oxide ($La_2O_3$) layer 24 may be additionally formed between the first gate insulation layer 25 and the first capping layer 22 in the first gate G1.

Figure 2B:
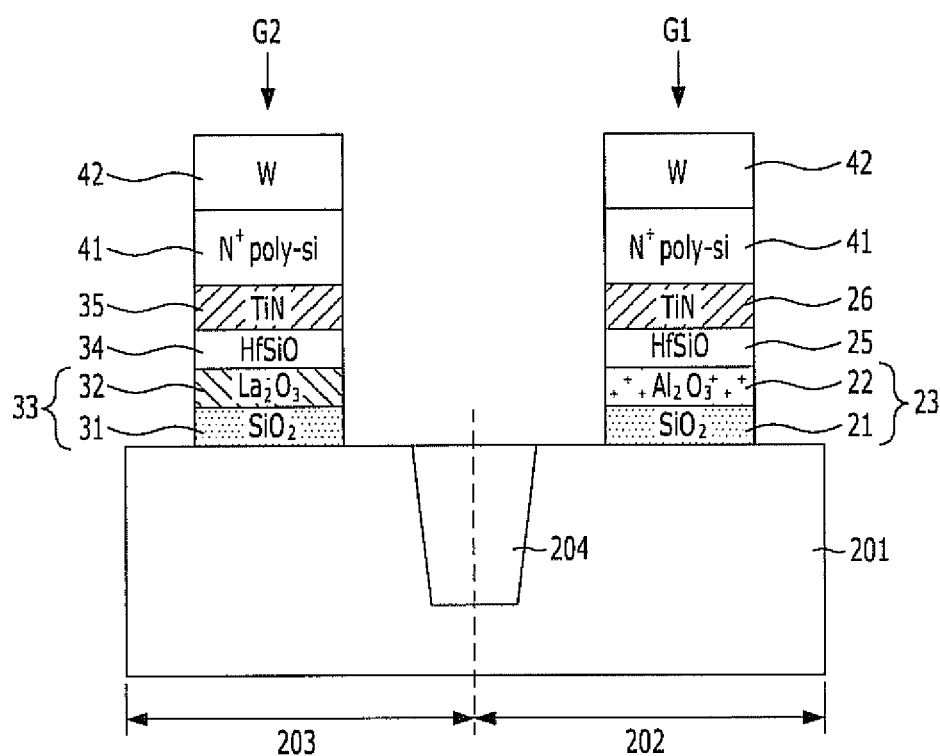
FIG. 2B illustrates a semiconductor device in accordance with a second exemplary embodiment of the present invention.

FIG. 2B illustrates a semiconductor device in accordance with a second exemplary embodiment of the present invention.

Referring to FIG. 2B, an isolation layer 204 for electrically isolating the first region 202 and the second region 203 from each other is formed over a substrate 201. The first region 202 is a PMOSFET region, and the second region 203 is an NMOSFET region. The substrate 201 may include a silicon substrate.

A first gate G1 is formed by first stacking a first work function control layer 23, a first gate insulation layer 25, and a first gate electrode 26. The first gate insulation layer 25 includes a high dielectric layer having a high dielectric constant (i.e., high-k). The first gate insulation layer 25 is formed of a metal silicate. According to an exemplary embodiment of the present invention, the metal silicate may include hafnium silicate (HfSiO). The first gate electrode 26 includes a metal nitride layer. According to an exemplary embodiment of the present invention, the first gate electrode 26 may include a titanium nitride (TiN) layer.

The first work function control layer 23 is formed between the substrate 201 and the first gate insulation layer 25 and induces a work function shift of the first gate electrode 26. In particular, the first work function control layer 23 increases the work function of the first gate electrode 26. The first work function control layer 23 includes a first interface layer 21 and a first capping layer 22 which has a higher oxygen concentration per unit area than the first interface layer 21. The first interface layer 21 may include a silicon oxide ($SiO_2$) layer, and the first capping layer 22 may include an aluminum oxide ($Al_2O_3$) layer. The silicon oxide ($SiO_2$) layer has an oxygen concentration of approximately 1 mol/volume, while the aluminum oxide layer has an oxygen concentration of approximately 1.37 mol/volume. Accordingly, a dipole is formed between the silicon oxide ($SiO_2$) layer and the aluminum oxide layer. For example, when the silicon oxide ($SiO_2$) layer and the aluminum oxide layer come into contact with each other, the oxygen of the aluminum oxide layer diffuses into the silicon oxide ($SiO_2$) layer. Accordingly, oxygen vacancies are formed in the aluminum oxide layer, and thus, the aluminum oxide layer with the oxygen vacancies becomes electrically positive, and the silicon oxide ($SiO_2$) layer into which the oxygen diffuses becomes electrically negative. As a result, a dipole is formed between the electrically positive material and electrically negative material. According to an exemplary embodiment of the present invention, when the aluminum oxide layer is formed over the silicon oxide ($SiO_2$) layer, the aluminum oxide layer becomes electrically positive and the silicon oxide ($SiO_2$) layer becomes electrically negative. Therefore, the work function of the first gate electrode 26 is increased.

Meanwhile, the second gate G2 is formed by stacking a second work function control layer 33, a second gate insulation layer 34, and a second gate electrode 35. The second gate insulation layer 34 includes a high dielectric layer having a high dielectric constant (i.e., high-k). The second gate insulation layer 34 is formed of metal silicate. According to an exemplary embodiment of the present invention, the metal silicate may include hafnium silicate (HfSiO). The second gate electrode 35 includes a metal nitride layer. According to an exemplary embodiment of the present invention, the second gate electrode 35 may include a titanium nitride (TiN) layer.

The second work function control layer 33 is formed between the substrate 201 and the second gate insulation layer 34 and induces a work function shift of the second gate electrode 35. In particular, the second work function control layer 33 decreases the work function of the second gate electrode 35. The second work function control layer 33 includes a second interface layer 31 and a second capping layer 32 which has a lower oxygen concentration per unit area than the second interface layer 31. The second interface layer 31 may include a silicon oxide ($SiO_2$) layer, and the second capping layer 32 may include a lanthanum oxide ($La_2O_3$) layer. The silicon oxide ($SiO_2$) layer has an oxygen concentration of approximately 1 mol/volume, while the lanthanum oxide ($La_2O_3$) layer has an oxygen concentration of approximately 0.88 mol/volume. Accordingly, a dipole is formed between the silicon oxide ($SiO_2$) layer and the lanthanum oxide ($La_2O_3$) layer. For example, when the silicon oxide ($SiO_2$) layer and the lanthanum oxide ($La_2O_3$) layer come into contact with each other, the oxygen of the silicon oxide ($SiO_2$) layer diffuses into the lanthanum oxide ($La_2O_3$) layer. Accordingly, oxygen vacancies are formed in the silicon oxide ($SiO_2$) layer. Thus, the silicon oxide ($SiO_2$) layer with the oxygen vacancies becomes electrically positive, and the lanthanum oxide ($La_2O_3$) layer into which the oxygen diffuses becomes electrically negative. As a result, a dipole is formed between the electrically positive material and the electrically negative material. According to an exemplary embodiment of the present invention, when the lanthanum oxide ($La_2O_3$) layer is formed over the silicon oxide ($SiO_2$) layer, the silicon oxide ($SiO_2$) layer becomes electrically positive and the lanthanum oxide ($La_2O_3$) layer becomes electrically negative. Therefore, the work function of the second gate electrode 35 is decreased.

The first gate G1 and the second gate G2 individually include an anti-reaction layer 41 and a low-resistance metallic layer 42 which are stacked over the first gate electrode 26 and the second gate electrode 35. The anti-reaction layer 41 includes a polysilicon layer. The polysilicon layer is doped with an N-type impurity of high concentration. The low-resistance metallic layer 42 is formed of a material for decreasing the resistance of each gate. For example, the low-resistance metallic layer 42 may include a tungsten (W) layer.

In the exemplary embodiment shown in FIG. 2B, the first gate G1 does not include a lanthanum oxide ($La_2O_3$) layer. According to the exemplary embodiments described above, since the first gate insulation layer 25 and the second gate insulation layer 34 include metal silicate, generation of leakage current is suppressed.

Since the first gate electrode 26 and the second gate electrode 35 each include a titanium nitride layer, the interface characteristics of the gate electrode with the gate insulation layers may be improved, and accordingly, its electron mobility characteristics may be improved as well.

Also, since the work function shift of the gate electrode appropriate for PMOSFET and/or NMOSFET is induced by forming the first work function control layer 23 and the second work function control layer 33 under the first gate insulation layer 25 and the second gate insulation layer 34, the threshold voltage of PMOSFET and/or NMOSFET is decreased.

Furthermore, the generation of leakage current is suppressed by a metal silicate used as the first gate insulation layer 25 and the second gate insulation layer 34, and drive current is increased by using a titanium nitride layer as the first gate electrode 26 and the second gate electrode 35 and by forming the first work function control layer 23 and the second work function control layer 33 under the first gate insulation layer 25 and the second gate insulation layer 34.

FIGS. 3 and 4 describe a dipole formation principle of a work function control layer in accordance with the exemplary embodiments of the present invention. FIG. 3 shows a case where it is applied to PMOSFET, and FIG. 4 shows a case where it is applied to NMOSFET.

Referring to FIG. 3, first, the silicon oxide ($SiO_2$) layer has an oxygen concentration of approximately 1 mol/volume, while the aluminum oxide layer has an oxygen concentration of approximately 1.37 mol/volume. Accordingly, a dipole 29 is formed between the silicon oxide ($SiO_2$) layer and the aluminum oxide layer. For example, when the silicon oxide ($SiO_2$) layer and the aluminum oxide layer come into contact with each other, the oxygen 27 of the aluminum oxide layer diffuses into the silicon oxide ($SiO_2$) layer. Accordingly, oxygen vacancies 28 are formed in the aluminum oxide layer. Thus, the aluminum oxide layer with the oxygen vacancies 28 becomes electrically positive, and the silicon oxide ($SiO_2$) layer into which the oxygen 27 diffuses becomes electrically negative. As a result, a dipole 29 is formed between the electrically positive material and the electrically negative material. According to an exemplary embodiment of the present invention, when the aluminum oxide layer is formed over the silicon oxide ($SiO_2$) layer, the aluminum oxide layer becomes electrically positive and the silicon oxide ($SiO_2$) layer becomes electrically negative. Therefore, the work function of the gate electrode 26 of the PMOSFET is increased.

Referring to FIG. 4, the silicon oxide ($SiO_2$) layer has an oxygen concentration of approximately 1 mol/volume, while the lanthanum oxide ($La_2O_3$) layer has an oxygen concentration of approximately 0.88 mol/volume. Accordingly, dipole 38 is formed between the silicon oxide ($SiO_2$) layer and the lanthanum oxide ($La_2O_3$) layer. For example, when the silicon oxide ($SiO_2$) layer and the lanthanum oxide ($La_2O_3$) layer come into contact with each other, the oxygen 36 of the silicon oxide ($SiO_2$) layer diffuses into the lanthanum oxide ($La_2O_3$) layer. Accordingly, oxygen vacancies 37 are formed in the silicon oxide ($SiO_2$) layer. Thus, the silicon oxide ($SiO_2$) layer with the oxygen vacancies 37 becomes electrically positive, and the lanthanum oxide ($La_2O_3$) layer into which the oxygen diffuses becomes electrically negative. As a result, a dipole 38 is formed between the electrically positive material and the electrically negative material. According to an exemplary embodiment of the present invention, when the lanthanum oxide ($La_2O_3$) layer is formed over the silicon oxide ($SiO_2$) layer, the silicon oxide ($SiO_2$) layer becomes electrically positive and the lanthanum oxide ($La_2O_3$) layer becomes electrically negative. Therefore, the work function of the gate electrode of the NMOSFET is decreased.

As described above, the dipoles 28 and 38 are formed between the silicon oxide ($SiO_2$) layer and a material in contact with the silicon oxide ($SiO_2$) layer.

FIGS. 5A to 5F describe a method for fabricating a semiconductor device in accordance with the first exemplary embodiment of the present invention.

Figure 5A:
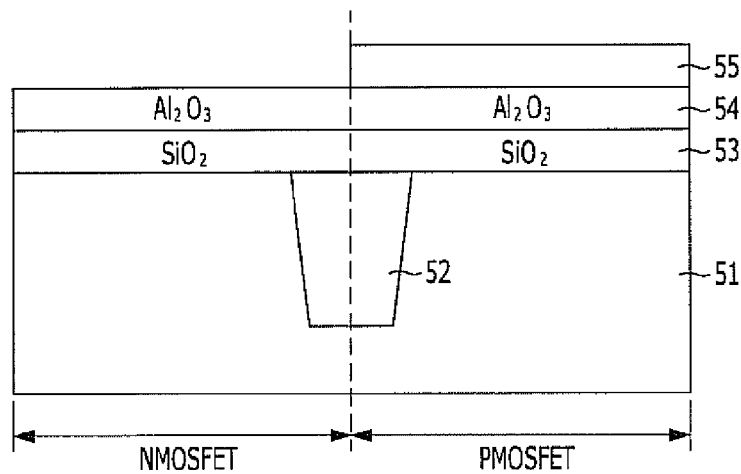
FIGS. 5A to 5F exemplarily describe a method for fabricating a semiconductor device in accordance with the first exemplary embodiment of the present invention.

Referring to FIG. 5A, an isolation layer 52 for electrically isolating a PMOSFET region and an NMOSFET region from each other is formed over a substrate 51 where the PMOSFET region and the NMOSFET region come in contact. The substrate 51 may include a silicon substrate. The isolation layer 52 may be formed through a Shallow Trench Isolation (STI) process. Although not illustrated in the drawing, P-type wells are formed in the NMOSFET region of the substrate 51 and N-type wells are formed in the PMOSFET region of the substrate 51.

An interface layer 53 is formed over the substrate 51. Before the interface layer 53 is formed, a cleaning process is performed to remove a natural oxide layer from the surface of the substrate 51. The cleaning process includes a hydrogen fluoride (HF) cleaning process. The HF cleaning process passivates dangling bonds on the surface of the substrate 51 with hydrogen. As a result, formation of an oxide layer is suppressed until a subsequent process is performed.

The interface layer 53 includes a silicon oxide ($SiO_2$) layer. Where the substrate 51 includes a silicon substrate, the interface layer 53 may be a silicon oxide ($SiO_2$) layer which is grown by oxidizing the surface of the silicon substrate. The interface layer 53 may be grown to have a thickness of approximately 10 Å. According to an exemplary embodiment, the interface layer 53 is grown through a wet oxidation method using ozone ($O_3$). The interface layer 53 improves the interface characteristics of the substrate and thereby improves electron mobility.

A first capping layer 54 is formed over the interface layer 53. The first capping layer 54 includes an aluminum oxide ($Al_2O_3$) layer. The aluminum oxide ($Al_2O_3$) layer is grown through an Atomic Layer Deposition (ALD) method to have a thickness of approximately 10 Å. According to the ALD method, the aluminum oxide ($Al_2O_3$) layer is grown by making trimethyl aluminum (TMA) react with ozone ($O_3$) at a temperature of approximately 450° C. The first capping layer 54 is a layer used for a PMOSFET.

The aluminum oxide ($Al_2O_3$) layer, which is used as the first capping layer 54, has a higher oxygen concentration per unit area than the silicon oxide ($SiO_2$) layer, which is used as the interface layer 53. For example, while the silicon oxide ($SiO_2$) layer has an oxygen concentration of approximately 1 mol/volume, the aluminum oxide ($Al_2O_3$) has an oxygen concentration of approximately 1.37 mol/volume.

Since there is a difference in the oxygen concentration per unit area between the aluminum oxide ($Al_2O_3$) layer and the silicon oxide ($SiO_2$) layer, oxygen diffuses from the aluminum oxide ($Al_2O_3$) layer to the silicon oxide ($SiO_2$) layer. When the oxygen diffuses, oxygen vacancies are formed in the aluminum oxide ($Al_2O_3$) layer and the aluminum oxide ($Al_2O_3$) layer with the oxygen vacancies becomes electrically positive. On the other hand, the silicon oxide ($SiO_2$) layer becomes electrically negative due to the oxygen diffusing into the silicon oxide ($SiO_2$) layer. As a result, a dipole is formed between the aluminum oxide ($Al_2O_3$) layer and the silicon oxide ($SiO_2$) layer. When the dipole is formed, the work function of a gate electrode which is to be formed subsequently is increased. Since the aluminum oxide ($Al_2O_3$) layer remains only in the second region where the PMOSFET is formed in the subsequent process, the work function of the gate electrode of the PMOSFET is increased.

A photolithography process is performed onto the first capping layer 54 to form a photoresist pattern 55 covering the PMOSFET region and expose the first capping layer 54 in the NMOSFET region. That is, the photoresist pattern 55 covers the first capping layer 54 in the PMOSFET region.

Figure 5B:
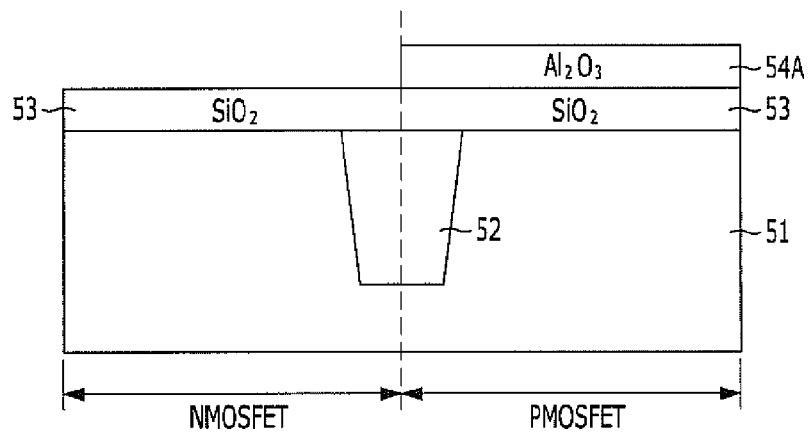

Referring to FIG. 5B, a portion of the first capping layer 54 is removed using the photoresist pattern 55 as an etch barrier. Accordingly, a first capping layer pattern 54A remains over the PMOSFET region, and the first capping layer 54 over the NMOSFET region is removed. A cleaning process for selectively removing aluminum oxide ($Al_2O_3$) may be performed to remove the first capping layer 54 from the upper portion of the NMOSFET region.

A cleaning process is performed after the photoresist pattern 55 is removed.

Figure 5C:
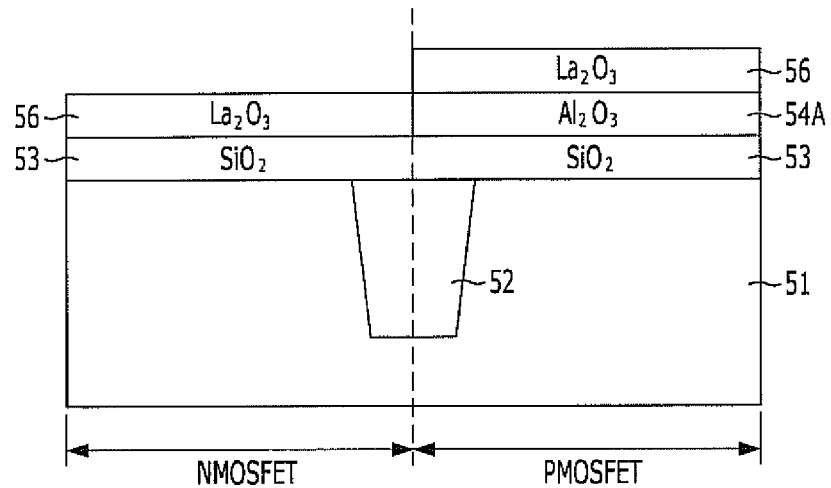

Referring to FIG. 5C, a lanthanum oxide ($La_2O_3$) layer is formed as a second capping layer 56 over the substrate structure including the first capping layer pattern 54A. The lanthanum oxide ($La_2O_3$) layer is grown to have a thickness of approximately 10 Å by performing an ALD method. According to the ALD method, the lanthanum oxide ($La_2O_3$) layer is grown by making Tris(ditetramethyl-heptandionato) lanthanum ($La(tmhd)_3$) react with $H_2O$ at a temperature of approximately 310° C.

Figure 5D:
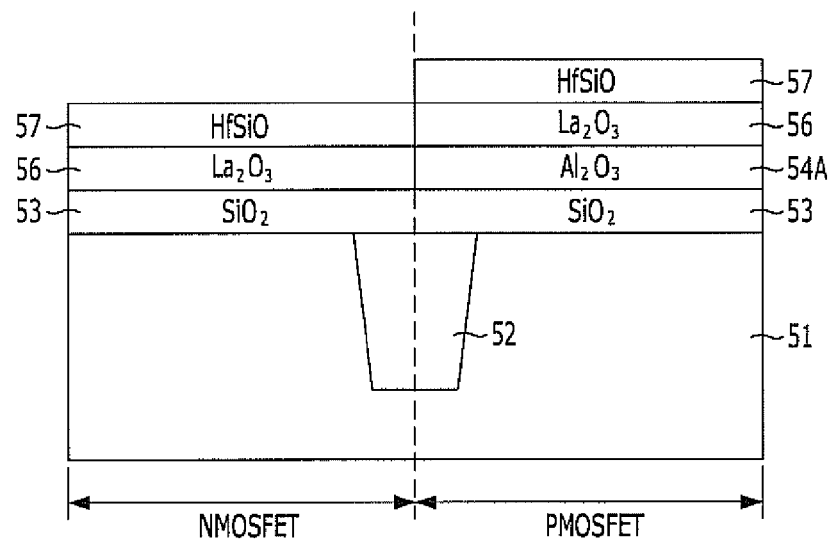

Referring to FIG. 5D, a gate insulation layer 57 is formed over the substrate structure including the second capping layer 56. The gate insulation layer 57 includes a metal silicate layer such as a hafnium silicate (HfSiO) layer. The hafnium silicate (HfSiO) layer is grown to have a thickness of approximately 30 Å through a Metal Organic Atomic Layer Deposition (MOALD) method. According to the MOALD method, the hafnium silicate (HfSiO) layer is grown by making tetrakisethylmethylamino hafnium (TEMAH), Tris(dimethylamino) silane (tris-DMASiH), and ozone ($O_3$) react with each other, or by making tetrakisethylmethylamino hafnium (TEMAH), Tris(ethylmethylamino) silane (tris-EMASiH), and ozone ($O_3$) react with each other at a temperature of approximately 330° C.

Subsequently, a plasma nitrification process is performed. The plasma nitrification process is performed by applying a power of approximately 3 kW at a temperature of approximately 600° C. under a pressure of approximately 1.0 Torr in an atmosphere of argon (Ar) and nitrogen ($N_2$) for approximately 120 seconds. The plasma nitrification process induces nitrogen to penetrate into the hafnium silicate layer and thereby prevents the phase separation of the hafnium silicate during a subsequent high-temperature thermal treatment.

Subsequently, an annealing process is performed. This process is called a post-dielectric annealing (PDA) process. The annealing process is performed at a temperature of approximately 950° C. under a pressure of approximately 10 Torr in an atmosphere of nitrogen ($N_2$) for approximately 60 seconds. Through the annealing process, the hafnium silicate layer is densified.

Through the plasma nitrification process and the PDA process described above, the leakage current of the hafnium silicate layer, which is used as the gate insulation layer 57, may be minimized.

Figure 5E:
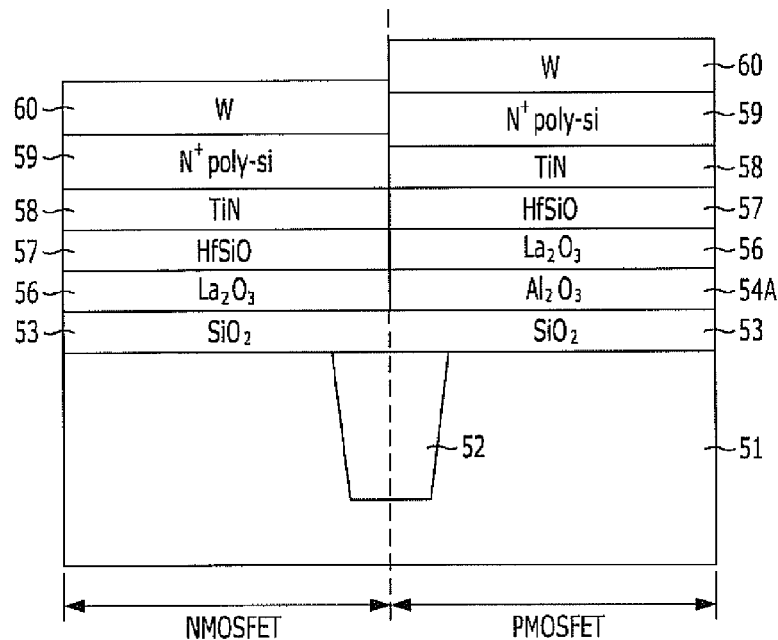

Referring to FIG. 5E, a gate conductive layer 58 is formed over the substrate structure. The gate conductive layer 58 includes a titanium nitride (TiN) layer, The titanium nitride (TiN) layer is grown to have a thickness of approximately 60 Å through a Plasma Enhanced Atomic Layer Deposition (PEALD) method. According to the PEALD method, the titanium nitride (TiN) layer is formed at a temperature of approximately 300° C. The titanium nitride (TiN) layer may be formed by making a titanium organic substance react with nitrogen plasma.

A polysilicon layer is formed over the gate conductive layer 58 as an anti-reaction layer 59. The polysilicon layer is formed to have a thickness of approximately 800 Å at a temperature of approximately 550° C. under a pressure of approximately 1.0 Torr. The polysilicon layer is formed by making silane ($SiH_4$) react with phosphine ($PH_3$). The polysilicon layer includes a high-concentration N-type impurity. Accordingly, the polysilicon layer includes an $N^+$-doped polysilicon layer. The anti-reaction layer 59 prevents a reaction between the gate conductive layer 58 and a tungsten (W) layer 60 which will be formed subsequently.

The tungsten (W) layer 60 is formed over the anti-reaction layer 59 to reduce resistivity of the gate electrode.

Figure 5F:
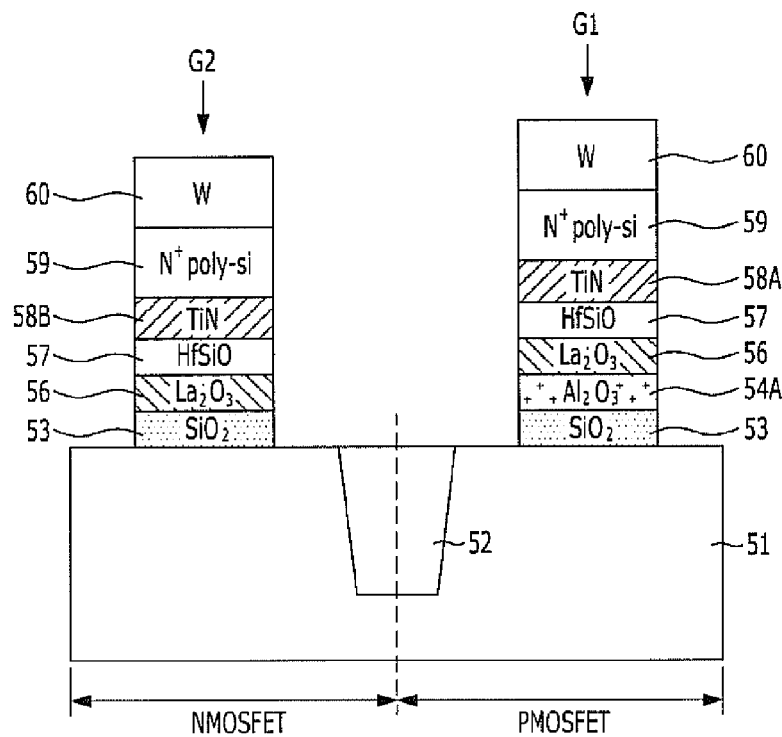

Referring to FIG. 5F, a gate mask (not shown) is formed through a photolithography process and a gate etch process is performed.

As a result, a first gate G1 is formed over the PMOSFET region of the substrate 51, and a second gate G2 is formed over the NMOSFET region of the substrate 51. The first gate G1 becomes a gate of the PMOSFET, and the second gate G2 becomes a gate of the NMOSFET. The second gate G2 includes the interface layer 53, the second capping layer 56, the gate insulation layer 57, and the gate electrode 58B. The first gate G1 includes the interface layer 53, the first capping layer pattern 54A, the second capping layer 56, the gate insulation layer 57, and the gate electrode 58A. Each of the first gate G1 and the second gate G2 further includes the anti-reaction layer 59 and the tungsten (W) layer 60 which are formed over the gate electrodes 58A and 58B.

Meanwhile, the process for fabricating the semiconductor device in accordance with the second exemplary embodiment of the present invention may be performed according to the same method as that of the first exemplary embodiment, except that the second capping layer 56 is removed from the PMOSFET region.

For example, to remove the second capping layer 56 from the first gate G1, the second capping layer 56 may be selectively removed from the PMOSFET region after the process of FIG. 5C. The semiconductor device in accordance with the second exemplary embodiment of the present invention has a final structure in which the second capping layer 56 of the first gate G1 is removed in the structure of FIG. 5F.

According to an exemplary embodiment of the present invention, since a metal silicate having a high dielectric constant is used for an NMOSFET and a PMOSFET, the off-state characteristics are improved and power consumption is reduced by suppressing leakage current therein. Therefore, it may be applied to mobile DRAM products.

Also, because a substance that induces a work function shift of a gate electrode is used, a work function shift appropriate for an NMOSFET and a PMOSFET is induced so as to lower threshold voltages thereof. As a result, operation speed is increased through the increase in drive current and the technology of the present invention may be applied to high-speed DRAM products.

Because a metal nitride layer is used as a gate electrode and a metal silicate is used as a gate insulation layer, the interface characteristics are improved between the gate electrode and the gate insulation layer. Therefore, electron transfer characteristics are improved and the drive current is increased so as to reduce the threshold voltage.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a gate insulation layer formed over a substrate and having a high dielectric constant;
    a gate electrode formed over the gate insulation layer;
    an anti-reaction layer formed over the gate electrode;
    a low-resistance metallic layer formed over the anti-reaction layer; and
    a work function control layer formed between the substrate and the gate insulation layer and inducing a work function shift of the gate electrode,
    wherein the work function control layer comprises a first layer and a second layer,
    wherein the first layer comprises an interface layer, and the second layer comprises an aluminum oxide layer and a lanthanum oxide layer.

2. The semiconductor device of claim 1, wherein the gate insulation layer comprises a metal silicate layer.

3. The semiconductor device of claim 1, wherein the gate insulation layer comprises a hafnium silicate layer.

4. The semiconductor device of claim 1, wherein the gate electrode comprises a titanium nitride layer.

5. The semiconductor device of claim 1, wherein the low-resistance metallic layer comprises a tungsten layer.

6. The semiconductor device of claim 1, wherein the lanthanum oxide layer is formed over the aluminum oxide layer.

7. The semiconductor device of claim 1, wherein the interface layer includes a silicon oxide layer.

8. A semiconductor device, comprising:
    a gate insulation layer formed over first and second regions of a substrate and having a high dielectric constant;
    a gate electrode formed over the gate insulation layer;
    an anti-reaction layer formed over the gate electrode ;
    a low-resistance metallic layer formed over the anti-reaction layer; and
    a work function control layer formed between the substrate and the gate insulation layer and configured to increase a work function of the gate electrode in the first region of the substrate and decrease a work function of the gate electrode in the second region of the substrate,
    wherein the work function control layer in the first region comprises a first layer and a second layer,
    wherein the first layer comprise an interface layer. and the second layer comprises an aluminum oxide layer and a lanthanum oxide layer.

9. The semiconductor device of claim 8, wherein the gate insulation layer comprises a hafnium silicate layer.

10. The semiconductor device of claim 8, wherein the gate electrode comprises a titanium nitride layer.

11. The semiconductor device of claim 8, wherein the first region and the second region comprise a PMOSFET region and an NMOSFET region of the substrate, respectively.

12. The semiconductor device of claim 8, wherein the work function control layer in the second region comprises a third layer and fourth layer sequentially stacked over the second region of the substrate, the fourth layer having a lower oxygen concentration per unit area than the third layer.

13. The semiconductor device of claim 12, wherein the third layer comprises a silicon oxide layer, and the fourth layer comprises a lanthanum oxide layer.

14. The semiconductor device of claim 8, wherein the low-resistance metallic layer comprises a tungsten layer.

15. The semiconductor device of claim 8, wherein the lanthanum oxide layer is formed over the aluminum oxide layer.

16. The semiconductor device of claim 8, wherein the interface layer includes a silicon oxide layer.

17. A semiconductor device, comprising:
    a gate insulation layer formed over a substrate and having a high dielectric constant;
    a gate electrode formed over the gate insulation layer;
    an anti-reaction layer formed over the gate electrode ;
    a low-resistance metallic layer formed over the anti-reaction layer; and
    a work function control layer formed between the substrate and the gate insulation layer and inducing a work function shift of the gate electrode,
    wherein the work function control layer comprises an interface layer, an aluminum oxide layer and a lanthanum oxide layer.

18. The semiconductor device of claim 17, wherein the lanthanum oxide layer is formed over the aluminum oxide layer.

19. The semiconductor device of claim 17, wherein the interface layer includes a silicon oxide layer.

* * * * *